United States Patent
Caihua et al.

(10) Patent No.: US 10,671,531 B2
(45) Date of Patent: Jun. 2, 2020

(54) SECONDARY MEMORY CONFIGURATION FOR DATA BACKUP

(71) Applicant: Seagate Technology LLC, Cupertino, CA (US)

(72) Inventors: Zheng Caihua, Singapore (SG); Zai Yu Nang, Singapore (SG); Tan Choon Kiat, Singapore (SG); Chng Yong Peng, Singapore (SG)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 28 days.

(21) Appl. No.: 16/034,629

(22) Filed: Jul. 13, 2018

(65) Prior Publication Data
US 2020/0019502 A1 Jan. 16, 2020

(51) Int. Cl.
*G06F 12/0804* (2016.01)
*G11C 14/00* (2006.01)

(52) U.S. Cl.
CPC ...... *G06F 12/0804* (2013.01); *G11C 14/0018* (2013.01); *G11C 14/0027* (2013.01); *G06F 2212/1032* (2013.01)

(58) Field of Classification Search
CPC ............... G06F 1/00–3296; G06F 3/00; G06F 3/06–0689; G06F 5/00–16; G06F 9/00–548; G06F 11/00–3696; G06F 12/00–16; G06F 13/00–4295; G06F 16/00–1986; G06F 17/00–5095; G06F 21/00–88; G06F 2003/0691–0698; G06F 2009/3883; G06F 2009/45562–45595; G06F 2201/00–885; G06F 2206/00–20;
(Continued)

(56) References Cited

U.S. PATENT DOCUMENTS 6,233,635 B1* 5/2001 Son .................. G06F 13/4291
710/315
7,099,993 B2* 8/2006 Keeler .............. G06F 12/0897
711/112

(Continued)

OTHER PUBLICATIONS

W. Song, Y. Zhou, M. Zhao, L. Ju, C. J. Xue and Z. Jia, "EMC: Energy-Aware Morphable Cache Design for Non-Volatile Processors," in IEEE Transactions on Computers, vol. 68, No. 4, pp. 498-509, Apr. 1, 2019. (Year: 2019).*

(Continued)

*Primary Examiner* — Daniel C. Chappell
(74) *Attorney, Agent, or Firm* — Westman, Champlin & Koehler, P.A.

(57) ABSTRACT

A data storage device includes a main storage memory and a non-volatile cache memory system. The non-volatile cache memory system comprises a master device, a first slave device communicatively coupled to the master device, the first slave device comprising a first non-volatile memory, and a second slave device communicatively coupled to the master device, the second slave device comprising a second non-volatile memory of a different type than the first non-volatile memory. The data storage device also includes a controller communicatively coupled to the main storage memory and to the non-volatile cache memory system, the controller is configured to, upon a power loss to the data storage device, store volatile data into the non-volatile cache memory system.

19 Claims, 4 Drawing Sheets

(58) Field of Classification Search
CPC .............. G06F 2209/00–2209/549; G06F 2211/00–902; G06F 2212/00–7211; G06F 2213/00–4004; G06F 2216/00–17; G06F 2221/00–2153; G11C 11/00–5692; G11C 13/00–06; G11C 14/00–009; G11C 15/00–06; G11C 16/00–3495; G11C 17/00–18; G11C 2216/00–30
See application file for complete search history.

(56) References Cited

U.S. PATENT DOCUMENTS

| | | | |
|---|---|---|---|
| 7,487,392 B2 | 2/2009 | Kawa et al. | |
| 7,898,859 B2* | 3/2011 | Ghodsi | G11C 11/005 365/185.11 |
| 8,345,478 B2 | 1/2013 | Ghodsi | |
| 8,462,552 B2 | 6/2013 | Ghodsi | |
| 8,468,370 B2* | 6/2013 | Miller | G06F 1/30 713/300 |
| 8,531,880 B2 | 9/2013 | Rao | |
| 8,671,243 B2* | 3/2014 | Chen | G06F 3/0655 711/104 |
| 9,367,255 B2* | 6/2016 | Yun | G11C 16/10 |
| 9,430,329 B2 | 8/2016 | Trantham | |
| 9,570,159 B1 | 2/2017 | Wakchaure et al. | |
| 9,632,714 B2* | 4/2017 | Makuni | G06F 12/0246 |
| 9,892,798 B2* | 2/2018 | Trantham | G11C 16/3418 |
| 2005/0251617 A1* | 11/2005 | Sinclair | G06F 3/061 711/103 |
| 2006/0274566 A1* | 12/2006 | Takashima | G06F 12/0246 365/145 |
| 2009/0132754 A1* | 5/2009 | Riska | G06F 3/0611 711/103 |
| 2011/0106804 A1* | 5/2011 | Keeler | G06F 3/061 707/737 |
| 2011/0283044 A1* | 11/2011 | Olds | G06F 11/004 711/102 |
| 2012/0284587 A1* | 11/2012 | Yu | G06F 3/0608 714/773 |
| 2014/0215111 A1* | 7/2014 | Zitlaw | G06F 13/161 710/105 |
| 2014/0281821 A1* | 9/2014 | Gaertner | G06F 11/1666 714/773 |
| 2015/0155050 A1* | 6/2015 | Trantham | G11C 16/3418 365/185.03 |
| 2015/0212957 A1* | 7/2015 | Yuan | B41J 2/17546 710/3 |
| 2017/0371580 A1* | 12/2017 | Kowles | G06F 3/0673 |
| 2018/0088833 A1* | 3/2018 | Tiotantra | G06F 3/0613 |
| 2019/0196824 A1* | 6/2019 | Liu | G06F 3/064 |

OTHER PUBLICATIONS

Jing Li, M. Zhao, Lei Ju, C. J. Xue and Zhiping Jia, "Maximizing forward progress with cache-aware backup for self-powered non-volatile processors," 2017 54th ACM/EDAC/IEEE Design Automation Conference (DAC), Austin, TX, 2017, pp. 1-6. (Year: 2017).*

Y. Zhou, M. Zhao, L. Ju, C. J. Xue, X. Li and Z. Jia, "Energy-aware morphable cache management for self-powered non-volatile processors," 2017 IEEE 23rd International Conference on Embedded and Real-Time Computing Systems and Applications (RTCSA), Hsinchu, 2017, pp. 1-7. (Year: 2017).*

Amro Awad, Mao Ye, Yan Solihin, Laurent Njilla, and Kazi Abu Zubair. 2019. Triad-NVM: persistency for integrity-protected and encrypted non-volatile memories. In Proceedings of the 46th International Symposium on Computer Architecture (ISCA '19). Association for Computing Machinery (Year: 2019).*

* cited by examiner

SECONDARY MEMORY CONFIGURATION FOR DATA BACKUP

SUMMARY

In one embodiment, a data storage device is provided. The data storage device includes a main storage memory and a non-volatile cache memory system. The non-volatile cache memory system comprises a master device, a first slave device communicatively coupled to the master device, the first slave device comprising a first non-volatile memory, and a second slave device communicatively coupled to the master device, the second slave device comprising a second non-volatile memory of a different type than the first non-volatile memory. The data storage device also includes a controller communicatively coupled to the main storage memory and to the non-volatile cache memory system, the controller is configured to, upon a power loss to the data storage device, store volatile data into the non-volatile cache memory system.

In another embodiment, a data storage device is provided. The data storage device includes a system memory and a controller. The controller is configured to capture information from a volatile cache memory system during normal operation of the data storage device. The controller is also configured to store the captured information into the non-volatile cache memory system during the normal operation of the data storage device, and upon a power loss to the data storage device, store volatile data into the non-volatile cache memory system.

In yet another embodiment, a method is provided. The method includes providing a controller coupled to a main storage memory of a data storage device. The method also includes providing a non-volatile cache memory as a first slave device to the controller. The method further includes providing a non-volatile cache memory of a different type than the first slave device as a second slave device communicatively coupled to the controller.

This summary is not intended to describe each disclosed embodiment or every implementation of the secondary memory configuration for data backup. Many other novel advantages, features, and relationships will become apparent as this description proceeds. Other features and benefits that characterize embodiments of the disclosure will be apparent upon reading the following detailed description and review of the associated drawings.

DETAILED DESCRIPTION

Figure 1:
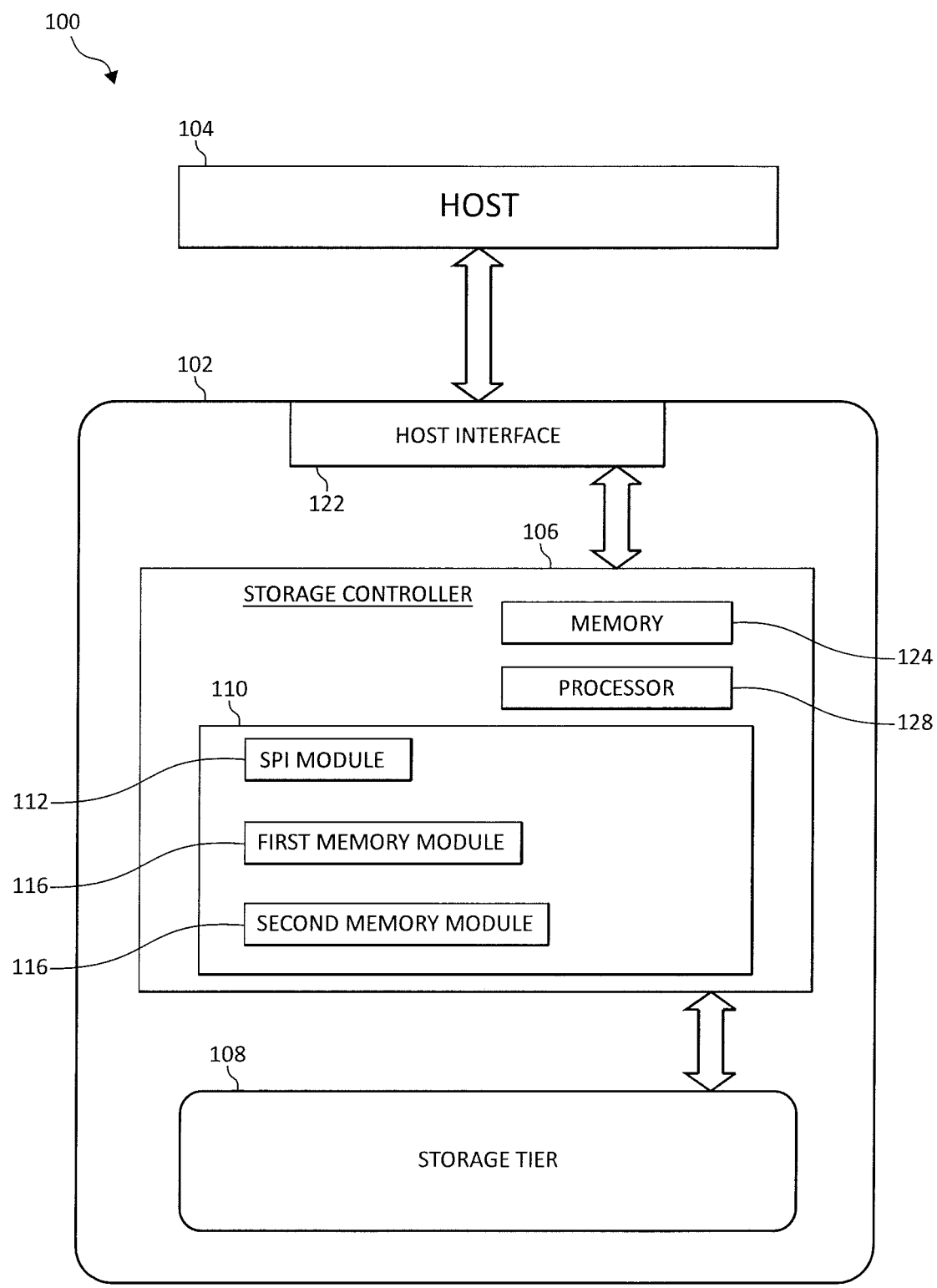
FIG. 1 is a block diagram of an example apparatus having a data storage device in accordance with one embodiment.

Although the present disclosure has been described with reference to embodiments, workers skilled in the art will recognize that changes may be made in form and detail without departing from the scope of the disclosure. The present disclosure generally describes a data storage device using a memory configured as a secondary slave to a primary non-volatile cache memory to add data logging capabilities and retain drive information that may be lost during power loss.

Data storage devices, such as hard disk drives, risk losing or corrupting user data when a sudden or rude power loss occurs. Sudden loss of power may cause issues such as operating system errors, or cause slowness, such as a command time out (CTO). These issues are especially apparent in devices using complex designs to achieve large capacities, such as devices with shingled magnetic recording (SMR) technology. When using SMR, a one track uncorrectable data error (UDE) may occur upon rude power loss while a band write operation (BWO) is ongoing. The UDE will then affect drive performance upon the next power cycle. Other information may also be saved to preserve drive performance, such as media cache link table information to reconstruct the media cache during the next power cycle.

To help reduce UDE, data storage devices using SMR may use NOR Flash as a non-volatile cache (NVC) memory to protect data in the event of sudden power loss. A one track UDE detection method may solve CTO issues by saving the active BWO operation, read/write and head parameters to the NOR Flash. This information can then be applied to resolve the one track UDE issue upon the next power cycle.

When hard disk drives become smaller, saving backup data to NOR Flash becomes more difficult. A data storage device may use back electromotive force (back EMF) to extract energy from spinning platers on a spindle motor of the hard disk drive. The spinning platers represent a reservoir of energy that may be used to power operations and back up data to the NOR Flash. Larger drives may have multiple platters of a larger size, and therefore provide more back EMF to draw from the spindle and may provide power for a longer period of time. Thus, larger hard disk drives allow more time to back up data to the NOR Flash and more data to be saved overall. For example, a 3.5" drive may have a "high" voltage of 7-8 Volt spindle back EMF but a 2.5" drive may have less than 1V after a retract load is applied. This low voltage allows approximately 60 microseconds to back up data during a rude power loss which enables approximately 5 bytes of data to be saved to the NOR Flash memory. 5 bytes of data may be insufficient for certain types of drives information, such as SMR drives, and this information (e.g., the media cache link table) may be lost if power is disrupted.

This disclosure provides configuring a data storage device with a Ferroelectric Random-Access Memory (FeRAM) in addition to the NOR Flash as a secondary slave. In one embodiment, a non-volatile cache memory system of a data storage drive comprises a master device including a serial peripheral interface (SPI) bus that couples to a NOR serial Flash memory and to a FeRAM. The NOR serial Flash memory serves as a first slave to the SPI bus and the FeRAM serves as a second slave. The FeRAM may be selected by a designated chip select signal or may share signals with the NOR serial Flash memory.

This configuration allows for frequent data logging and approximately 190 bytes of information may be saved during a sudden power loss. Further, FeRAM may write approximately 10 times faster than NOR Flash because it does not need to erase before writing and has low power consumption with less performance effects. Thus, using FeRAM as a second slave to the NVC memory saves programming overhead, backs up more data during rude/sudden power loss, and may improve disk drive performance and reliability, as data storage device performance data may be saved periodically to the FeRAM rather than writing to disk media. An example of a data storage device in which a NOR Flash and FeRAM configuration is applied is described below in connection with FIG. 1.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

FIG. 1 is a block diagram of an example apparatus 100 that includes a data storage device 102 in accordance with one embodiment. Data storage device 102 includes a storage controller or control circuit 106 that communicatively couples a storage tier 108 to a host 104 via a host interface 122. In an implementation, the storage tier 108 is a dynamic storage tier. The storage controller 106 provides a mechanism to allow the host 104 to store data to and retrieve data from the storage tier 108. In an implementation, the storage tier 108 may be a main data store. The storage tier 108 may include without limitation one or more of magnetic data storage discs, optical data storage discs, non-volatile random access memory (RAM), such as NAND Flash memory and a volatile RAM storage medium such as dynamic random access memory (DRAM).

The storage controller 106 may utilize communication interfaces and protocols including SATA (serial advanced technology attachment), SCSI (small computer system interface), eSATA (external serial advanced technology attachment), SAS (serial attached SCSI), USB (universal serial bus), and others to communicate with the host 104 via the host interface 122. The storage controller 106 also has a management module 110 that includes program code having instructions to capture information for data logging or for backing up data during rude power loss in a manner to resolve, for example, one track UDE issues upon the next power cycle.

As can be seen in FIG. 1, the storage controller 106 also includes a memory 124 that may be used for storing data and/or one or more modules such as module 110 in some embodiments. It should be noted that, in different embodiments, module 110 may comprise hardware, software and/or firmware. The storage controller 106 further includes a processor 128. The processor 128 may perform functions of the storage controller 106 including functions disclosed herein as performed by module 110. The processor 128 may execute instructions stored on non-transitory computer readable media to perform the functions of the storage controller 106.

In one embodiment, module 110 may include multiple sub-modules. The sub-modules may include an SPI module 112, a first memory module 114, and a second memory module 116. The first memory module 114 may be a device driver that operates a first memory slave, e.g., a NOR serial Flash memory. The second memory module 116 may include a device driver that operates a second memory slave, e.g., a FeRAM memory. The SPI module 112 may manage communications between the NVC memory of the first memory module 114 and second memory module 116 and enable frequent data logging during device operations and data back up during rude power loss. The SPI module 112 and first and second memory modules, 114, 116 may be part of a microprocessor system (e.g., microprocessor system 404 of FIG. 4) that provides communication and control for a data storage device 102.

Figure 2:
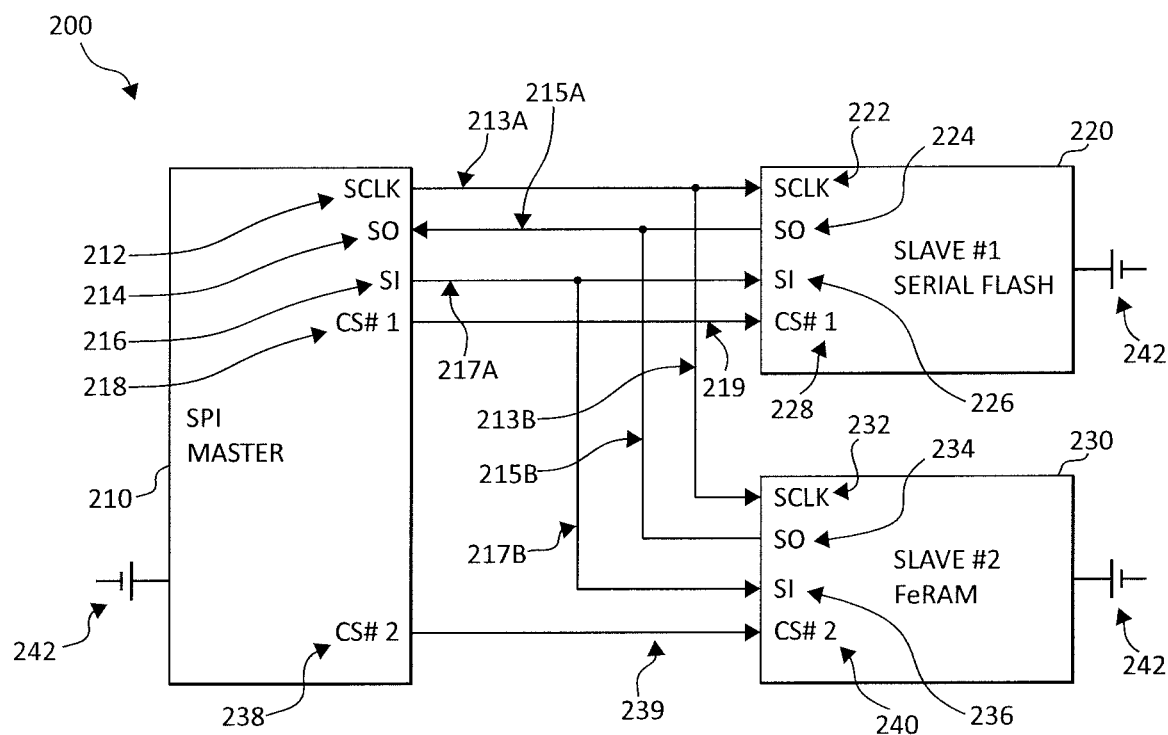
FIG. 2 is a schematic diagram of an example apparatus according to an embodiment of the present disclosure.

FIG. 2 illustrates a non-volatile memory (NVM) configuration 200 utilizing a second memory as a slave to SPI communications and NOR serial Flash. Configuration 200 includes an SPI master 210 with a first memory, or first slave 220, and a second memory, or second slave 230. The first slave 220 may be a NOR serial Flash or other non-volatile memory and the second slave 230 may be FeRAM or other memory acting as a non-volatile cache. The SPI master 210 includes a clock signal (SCLK) 212, a signal output (SO) 214, signal input (SI) 216, a chip signal for the first slave, or first chip signal (CS #1) 218, and a chip signal for the second memory slave, or second chip signal (CS #2) 238. The SPI master 210 is communicatively coupled with the first slave 220 by a plurality of connections. As can be seen in FIG. 2, a first clock connector 213A couples SCLK 212 to SCLK 222 of the first slave 220, a first output connector 215A couples SO 214 to SO 224 of the first slave 220, and a first input connector 217A couples SI 216 to SI 226 of the first slave 220. The first chip signal 218 couples to the control 228 of the first slave 220 by a connector 219.

The second memory, or second slave 230 utilizes the same signals from the SPI master 210 for SCLK 212, SO 214 and SI 216 in order to act as a secondary slave to the SPI communications and the first memory, or first slave 220. This memory configuration enables a data storage device to utilize the same form factor specifications of similar sized data storage devices with a limited cost increase. The SPI master 210 is communicatively coupled with the second slave 230 by a plurality of connections. As can be seen in FIG. 2, a second clock connector 213B couples SCLK 212 to SCLK 232 of the second slave 230, a second output connector 215B couples SO 214 to SO 234 of the second slave 230, and a second input connector 217B couples SI 216 to SI 236 of the second slave 230. Further, SPI master 210 includes the second chip signal 238 coupled to the control 240 of the second slave 230 by connector 239. Additionally, the SPI master 210, first slave 220, and second slave 230 may be coupled to a power connector 242.

Power connector 242 provides power to the configuration 200 during operations as well as during a rude power loss. During normal operations, such as during data logging by the second slave 230, power may come from system power, e.g., power from data storage device 102. During a rude power loss, power may be provided from a variety of sources. As discussed above, power may be provided from spindle back EMF during rude power loss. Further, smaller drives may not provide enough back EMF to power a sustained data backup (e.g., approximately 60 microseconds of backup time is available for a 2.5" drive). Power may also be provided from residual power in the system, e.g., from system capacitors. Alternatively, capacitors may be added to the configuration 200 to provide power to the SPI master 210, first memory 220, and second memory 230 during power loss. For example, capacitors may be added to configuration 200 to increase the time available to backup data to second memory 230.

First memory 220 and second memory 230 may each have a device driver code (e.g., memory modules 114 and 116 of FIG. 1) to communicate with the SPI master code (e.g., SPI module 112) and perform operations, such as data logging and data backup during rude power loss. The clock signal is provided to synch the first and second memory slaves 220, 230 and the first chip signal 218 may be engaged to select operations on the first memory 220 and second chip signal 238 may be engaged to select operations on the second memory 230. Thus, first chip signal 218 and second chip signal 238 determine which of the first or second memory slaves 220, 230 are to be used in each operation. For example, if the first memory 220 (e.g., NOR Flash) is to be used, the first chip signal 218 may be run "high" and second chip signal 238 may be run "low" in order to select the first memory 220 for operations. If the second memory 230 is to be used, the first chip signal 218 may be run "low" and second chip signal 238 may be run "high" in order to select the second memory 220 for operations.

Figure 3:
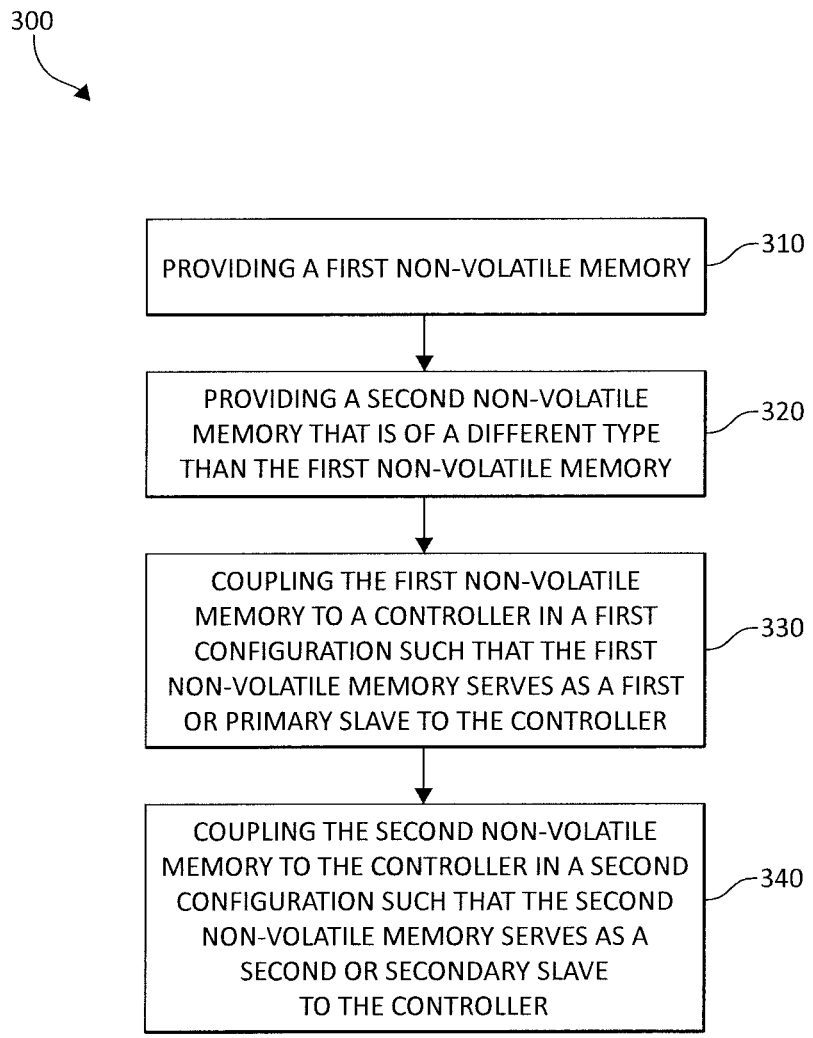
FIG. 3 is a block diagram illustrating a method of a data storage device using a secondary memory configuration according to an embodiment of the present disclosure.

FIG. 3 is diagram of a method 300 of increasing NVC capability of a data storage device. The method includes a first block 310 of providing a first non-volatile memory. A second block 320 includes providing a second non-volatile memory that is of a different type than the first non-volatile memory (e.g., NOR serial Flash). A third block 330 includes coupling the first non-volatile memory to a controller in a first configuration such that the first non-volatile memory serves as a first or primary slave to the controller (e.g., FeRAM non-volatile memory). Finally, a fourth block 340 provides coupling the second non-volatile memory to the controller in a second configuration such that the second non-volatile memory serves as a second or secondary slave to the controller.

Figure 4:
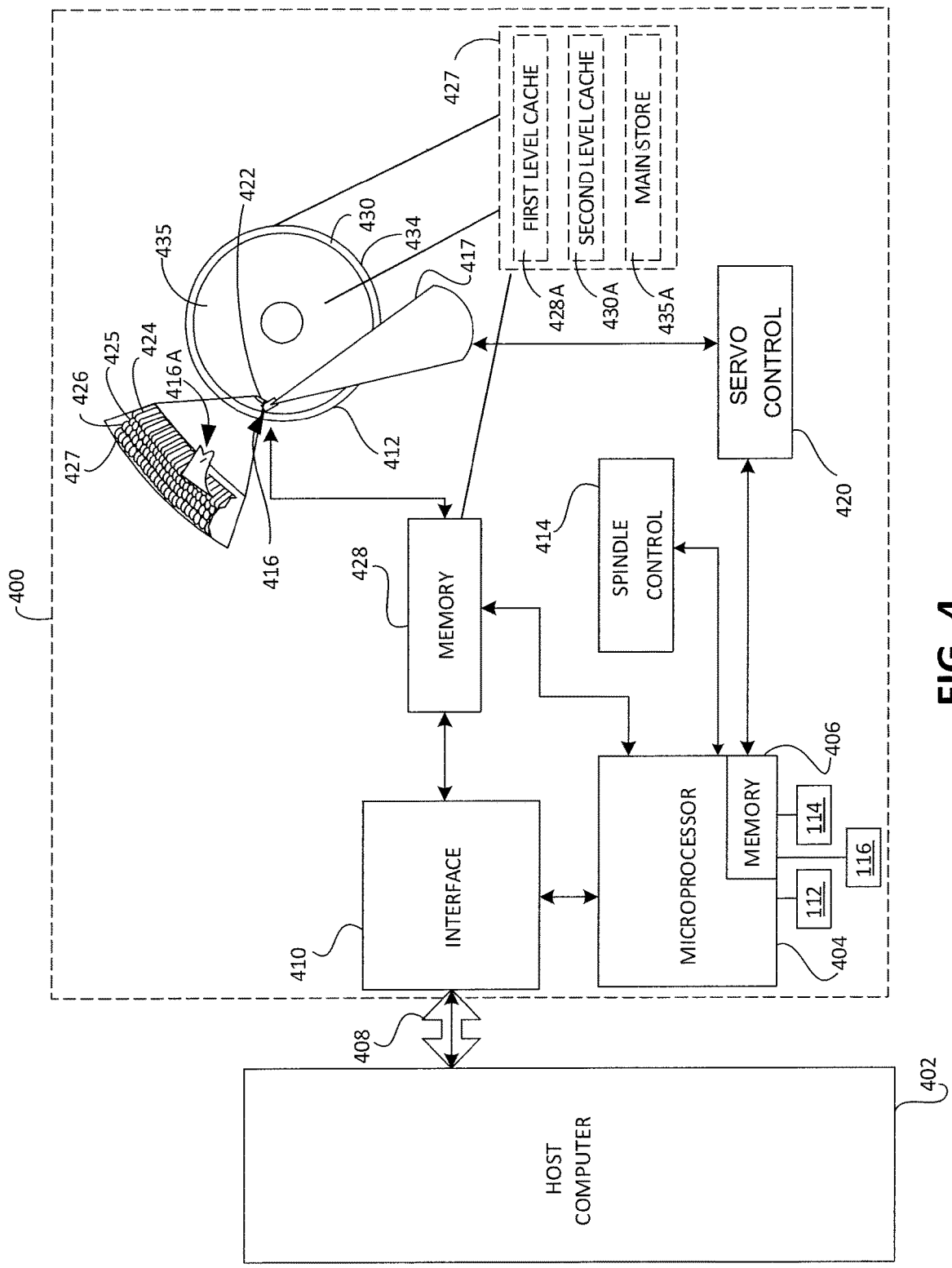
FIG. 4 is a block diagram of a data storage device that employs a secondary memory configuration in accordance with one embodiment.

FIG. 4 shows a block diagram of the disc drive 400 that employs a secondary memory configuration in accordance with one embodiment. Disc drive 400 is a particular example of a data storage device 102 (of FIG. 1). As will be described in detail further below, in one embodiment disc drive 400 employs one or more discs on which multiple data tracks may be written in a partially-overlapping shingled pattern, with each successive track overwriting a portion of the previous track. In another embodiment, disc drive 400 employs one or more discs on which no data tracks are written in a partially-overlapping shingled pattern.

Disc drive 400 is shown in FIG. 4 to be operably connected to a host computer 402 in which disc drive 400 may be mounted. Disc drive 400 includes a microprocessor system 404 that generally provides top level communication and control for disc drive 400 in conjunction with programming for microprocessor system 404 stored, for example, in microprocessor memory 406. Disc drive 400 may communicate with host computer 402 using a bus 408.

Memory 406 can include RAM, read only memory ROM, and other sources of resident memory for microprocessor 404. Memory 406 may also include a first memory slave of non-volatile memory such as NOR serial Flash (e.g., first memory 220), and/or a second memory slave or non-volatile memory such as FeRAM (e.g., second memory 230). Microprocessor 404 may also include device drivers for managing the first and second slaves (e.g., SPI module 112, first memory module 114 or second memory module 116 in storage controller 106 of FIG. 1).

Disc drive 400 includes one or more data storage discs 412. Discs 412 are rotated at a substantially constant high speed by a spindle control circuit 414. One or more heads 416 communicate with the surface(s) of discs 412 to carry out data read/write operations. The radial position of heads 416 is controlled through the application of current to a coil in an actuator assembly 417. A servo control system 420 provides such control.

As noted above, in some embodiments, tracks may be written on one or more storage discs 412 in a partially-overlaying relationship. The overlaying of tracks is shown in close-up view of area 422 of disc(s) 412. In area 422, a corner of head 416A is shown writing a track portion 424. Different shading within the track portion 424 represents different magnetic orientations that correspond to different values of stored binary data. The track portion 424 is overlaid over part of track portion 425. Similarly, track portion 425 is overlaid over part of portion 426, portion 426 is overlaid over portion 427, etc.

The portions 424-427 may be part of what is referred to herein as a physical band which, in this embodiment, may include tens, hundreds or thousands of similarly overlapping, concentric portions 424-427. Gaps are created between such physical bands so that each physical band can be updated independently of other physical bands. The overlaying of successive track portions within a physical band in shingled magnetic recording (SMR) means that individual parts of the physical band may not be randomly updated on their own. This is because spacings between centers of track portions 424, 425, 426, 427, for example, are smaller than a width of a write pole (not separately shown) of head 416. However, a width of a reader (not separately shown) of head 416 may be small enough to read individual track portions 424, 425, 426, 427, thereby enabling random reads of data to be carried out.

In certain embodiments, disc drive 400 includes a memory 428 that may serve as, for example, a first/upper level cache denoted by reference numeral 428A. In some embodiments, memory 428 is physically separate from discs 412. The memory 428 may be of a different type than the discs 412. For example, in certain embodiments, memory 428 may be constructed from solid-state components. In one embodiment, memory 428 may be a Flash memory.

In some embodiments, the one or more storage discs 412 are managed as non-overlapping disc portion 430 and disc portion 435. In some embodiments, disc portion 430 is used for a second level cache denoted by reference numeral 430A and disc portion 435 serves as a main store denoted by reference numeral 435A. In an alternate embodiment, each of the first level cache 428A, the second level cache 430A and the main store 435A may be allocated from a pool of memory locations that includes, for example, storage locations from memory 428 and storage locations or physical bands from storage discs 412. Dashed box 427 of FIG. 4 indicates that, in the alternate embodiment, the entire set of storage locations that constitutes the storage space supplied by disc(s) 412 and memory 428 in disc drive 400 may be organized for three uses, namely the first level cache 428A, the second level cache 430A and main store 435A.

In the embodiment of FIG. 4, disc drive 400 may use memory 428 in conjunction with disc portion 430 in order to manage data as the data is being transferred to main storage locations 435 on disc(s) 412. In the interest of simplification, components such as a read/write channel which encodes data and provides requisite write current signals to heads 416 is not shown in FIG. 4. Also, any additional buffers that may be employed to assist in data transfer to the memory 428 and the main storage locations 435 are not shown in the interest of simplification.

As noted above, SMR may be used for storage in disc portion 430, which serves as second-level cache 430A. Also, as can be seen in FIG. 4, main storage locations 435 are on a same data storage medium as the second-level cache locations 430. Thus, in the embodiment of FIG. 4, second-level cache 430A is a media cache.

As indicated above, in high capacity devices and devices with complex designs including SMR, one track UDE may occur upon rude power loss while the BWO (e.g., write operation of physical bands such as portions 424-427) is ongoing. NOR Flash may be used as the non-volatile memory to save active BWO operations and used upon the next power cycle to handle the one track UDE issue. To help reduce data loss in disc drive 400, embodiments of the disclosure enable a greater amount of data to be saved in the FeRAM acting as a secondary slave to the NOR Flash. This may be carried out by modules 112, 114, and 116 which may be part of microprocessor system 404 or may be separate components coupled to microprocessor system 404. Modules 112, 114 and 116 operate in a manner described above in connection with FIG. 1 and carry out data backup and data logging operations in a manner described in connection with FIGS. 1 and 2.

A plurality BWO information may be stored in secondary slave memory during a rude power loss. Other information may also be stored in the secondary slave to be restored upon a next power up. In one example with FeRAM acting as a secondary slave (e.g., secondary memory 230), outstanding BWO may be logged into volatile memory (e.g., DRAM) and upon rude power loss, open and uncompleted BWO information may be saved into the FeRAM. Media cache (e.g., media cache link table information) and outstanding BWO operation information may also be logged directly into the secondary memory. During the next power up, outstanding BWO captured by the FeRAM may be converted to a media cache node. Upon a band read operation (BRO), the media cache node may be merged with existing data read back from the main store, and then re-written back to the main store.

Use of the secondary memory configuration described above has many advantages. For example, a data storage device for which embodiments of the present disclosure may be used is a 2.5" drive using SMR technology. A 2.5" drive may include a servo SOC power device to retract functionality after detecting that hard drive power supply is below a threshold level. When a power threshold level is reached, the servo SOC will disable main SOC rails and assert a reset. Retraction may then continue in the background without communicating with the SOC. As discussed above however, in the event of a rude power loss, power is available for approximately 60 microseconds to back up approximately 5 bytes of data to NOR Flash. With SMR technology, to preserve information such as the media cache link table and open BWO band during rude power loss, at least 128 bytes of data should be backed up in NVC memory. Thus, FeRAM provides many advantages as a secondary NVC memory.

FeRAM allows fast write and read operations as it does not have to erase before writing. This feature further saves programming overhead and does not employ wear-leveling. FeRAM further allows ten years or more of data retention with an unlimited write endurance. FeRAM also includes a low power mode with a small footprint. These features and more enable FeRAM to provide data protection upon sudden power loss as described in the secondary memory configurations embodied herein.

The embodiments also improve data storage device performance, as performance data may be periodically logged to the FeRAM acting as a secondary slave instead of writing to a disk media. In a comparison between NOR serial Flash and FeRAM, FeRAM has a greater ability for frequent data logging, data saved during rude power loss, and in other concerns. For example, in frequent data logging, FeRAM may carry out $10^{-12}$ program cycles with a ten-year data retention, write 128 bytes in approximately 25 microseconds, and does not employ wear leveling. In comparison, NOR Flash has an 100K erase cycle and writes 128 bytes in approximately 250 microseconds. NOR Flash also may have wear leveling issues, has a limited flash capacity, and may have to calculate device initialization time or TTR (time to ready) effects for performance. Thus, FeRAM as used in the embodiments described in the present disclosure may be suitable for both data back up during rude power loss as well as for frequent data logging due to the advantages in read/write tolerance, speed, memory size, and performance.

The illustrations of the embodiments described herein are intended to provide a general understanding of the method of the various embodiments. The illustrations are not intended to serve as a complete description of all of the elements and features of methods and systems described herein. Many other embodiments may be apparent to those of skill in the art upon reviewing the disclosure. Other embodiments may be utilized and derived from the disclosure, such that structural and logical substitutions and changes may be made without departing from the scope of the disclosure. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed is:
1. A data storage device, comprising:
   a main storage memory;
   a non-volatile cache memory system comprising:
      a master device;

a first slave device communicatively coupled to the master device, the first slave device comprising a first non-volatile memory having a first performance level; and a second slave device communicatively coupled to the master device, the second slave device comprising a second non-volatile memory of a different type than the first non-volatile memory, the second slave device having a second performance level that is higher than the first performance level, the first performance level and the second performance level each being a measure of a same performance aspect of the first slave device and the second slave device;

the first slave device and the second slave device sharing a signal from the master device, the master device configured to:
prioritize the first slave device for data storage over the second slave device during normal operation of the data storage device, and
select the second slave device for data backup upon power loss to the data storage device; and a controller communicatively coupled to the main storage memory and to the master device of the non-volatile cache memory system, the controller configured to, upon a power loss to the data storage device, store volatile data into the second slave device.

2. The data storage device of claim 1, and wherein the first non-volatile memory comprises a NOR serial Flash memory.

3. The data storage device of claim 2, and wherein the NOR serial Flash memory has a first data rate.

4. The data storage device of claim 3, and wherein the second non-volatile memory comprises a FeRAM non-volatile memory.

5. The data storage device of claim 4, and wherein the FeRAM non-volatile memory has a second data rate that is higher than the first data rate.

6. The data storage device of claim 1, and wherein the volatile data includes band write operation information.

7. The data storage device of claim 1, and wherein volatile data includes media cache link table information.

8. The data storage device of claim 1, and wherein the controller is further configured to employ the second slave device for data logging operations.

9. The data storage device of claim 1, and wherein the master device is a serial peripheral interface bus.

10. The data storage device of claim 1, and wherein the first slave device and second slave device receive a shared clock signal, signal output, and signal input from the master device.

11. The data storage device of claim 1, and wherein the master device generates a chip select signal for selecting the first slave device and a chip select signal for selecting the second slave device.

12. The data storage device of claim 1, wherein the main storage memory utilizes shingled magnetic recording technology.

13. The data storage device of claim 1, and wherein the performance aspect is a data storage rate.

14. A data storage device comprising:
a non-volatile cache memory system;
a controller configured to:
capture information from a volatile cache memory system during normal operation;
store the captured information into a first slave device of the non-volatile cache memory system during normal operation of the data storage device at a first data rate; and
upon a power loss from a system power to the data storage device, store volatile data into a second slave device of the non-volatile cache memory system at a second data rate that is higher than the first data rate.

15. The data storage device of claim 14, and wherein the first slave device comprises a NOR serial Flash memory.

16. The data storage device of claim 14, and wherein the second slave device comprises a FeRAM non-volatile memory.

17. A method comprising:
providing a controller coupled to a main storage memory of a data storage device;
providing a first non-volatile memory as a first slave device having a first performance level to the controller;
providing a second non-volatile memory of a different type than the first non-volatile memory as a second slave device communicatively coupled to the controller, the second slave device having a second performance level that is higher than the first performance level, each of the first performance level and the second performance level being a measure of a same performance aspect of the first slave device and the second slave device, the first slave device and the second slave device sharing a signal from the controller;
prioritizing the first slave device over the second slave device for data storage by the controller during normal operation of the data storage device;
selecting the second slave device for data backup upon a power loss to the data storage device;
storing, by the controller, volatile data to the second slave device upon the power loss.

18. The method of claim 17, and wherein the first slave device comprises a NOR serial Flash memory.

19. The method of claim 17, and wherein the second slave device comprises a FeRAM non-volatile memory.

* * * * *